United States Patent [19]
Bonde et al.

[11] Patent Number: 5,099,311
[45] Date of Patent: Mar. 24, 1992

[54] MICROCHANNEL HEAT SINK ASSEMBLY

[75] Inventors: Wayne L. Bonde, Livermore; Robert J. Contolini, Pleasanton, both of Calif.

[73] Assignee: The United States of America as represented by the United States Department of Energy, Washington, D.C.

[21] Appl. No.: 642,736

[22] Filed: Jan. 17, 1991

[51] Int. Cl.$^5$ .................... H01L 25/04; H01L 23/02; F28F 7/00; H02B 1/00
[52] U.S. Cl. ........................................ 357/82; 357/81; 165/80.4; 361/386; 439/196
[58] Field of Search ...................... 357/82, 81, 74, 79; 165/80.4, 80.5; 439/179, 196; 361/386

[56] References Cited

U.S. PATENT DOCUMENTS

| | | | |
|---|---|---|---|
| 4,361,717 | 11/1982 | Gilmore et al. | 357/82 |
| 4,450,472 | 5/1984 | Tuckerman et al. | 357/82 |
| 4,567,505 | 1/1986 | Pease et al. | 357/81 |
| 4,573,067 | 2/1986 | Tuckerman et al. | 357/82 |
| 4,758,926 | 7/1988 | Herrell et al. | 357/81 |
| 4,893,590 | 1/1990 | Kashimura et al. | 165/80.4 |
| 4,894,709 | 1/1990 | Phillips et al. | 357/82 |

FOREIGN PATENT DOCUMENTS

| | | | |
|---|---|---|---|
| 2415893 | 10/1974 | Fed. Rep. of Germany | 357/82 |
| 1007596 | 10/1965 | United Kingdom | 357/82 |

OTHER PUBLICATIONS

R. J. Phillips, "Microchannel Heat Sinks," The Lincoln Laboratory J., vol. 1, No. 1, pp. 31-48, (1988).
R. J. Phillips, "Microchannel Heat Sinks," Advances in Thermal Modeling of Electronic Components and Systems, vol. 2, Chapter 3, pp. 109-122 and pp. 165-171, (1990).
A. E. Bergles et al., "Direct Liquid Cooling of Micro-electronic Components," Advances in Thermal Modeling of Electronic Components and Systems, vol. 2, Chapter 5, pp. 233-254, (1990).

Primary Examiner—Rolf Hille
Assistant Examiner—Mahshid Saadat
Attorney, Agent, or Firm—Henry P. Sartorio; L. E. Carnahan; William R. Moser

[57] ABSTRACT

The present invention provides a microchannel heat sink with a thermal range from cryogenic temperatures to several hundred degrees centigrade. The heat sink can be used with a variety of fluids, such as cryogenic or corrosive fluids, and can be operated at a high pressure. The heat sink comprises a microchannel layer preferably formed of silicon, and a manifold layer preferably formed of glass. The manifold layer comprises an inlet groove and outlet groove which define an inlet manifold and an outlet manifold. The inlet manifold delivers coolant to the inlet section of the microchannels, and the outlet manifold receives coolant from the outlet section of the microchannels. In one embodiment, the manifold layer comprises an inlet hole extending through the manifold layer to the inlet manifold, and an outlet hole extending through the manifold layer to the outlet manifold. Coolant is supplied to the heat sink through a conduit assembly connected to the heat sink. A resilient seal, such as a gasket or an O-ring, is disposed between the conduit and the hole in the heat sink in order to provide a watetight seal. In other embodiments, the conduit assembly may comprise a metal tube which is connected to the heat sink by a soft solder. In still other embodiments, the heat sink may comprise inlet and outlet nipples. The present invention has application in supercomputers, integrated circuits and other electronic devices, and is suitable for cooling materials to superconducting temperatures.

18 Claims, 7 Drawing Sheets

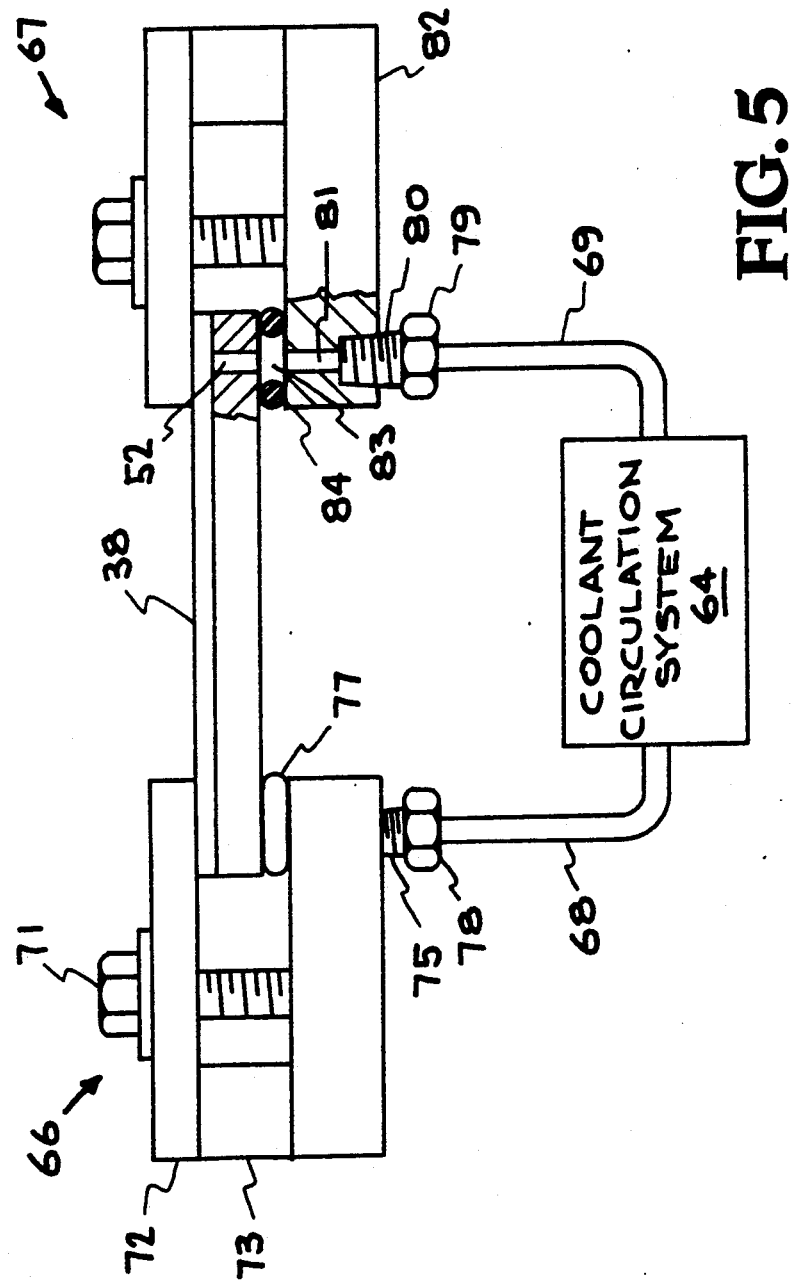

MICROCHANNEL HEAT SINK ASSEMBLY

The U.S. Government has rights in this invention pursuant to Contract No. W-7405-ENG-48 between the U.S. Department of Energy and the University of California for the operation of Lawrence Livermore National Laboratory.

BACKGROUND OF THE INVENTION

1. Field of the Invention

The present invention relates to small, compact heat sinks that include microchannels with coolant flowing therethrough. More specifically, the present invention relates to heat sinks with a wide thermal range that includes cryogenic temperatures so that the coolers are suitable for cooling to superconductor temperatures. The invention also relates to cooling integrated circuits.

2. Description of Related Art

Heat generation is a common problem with semiconductor devices such as integrated circuits. Temperature buildup can reduce the lifetime of semiconductor components, change their electrical characteristics, and at high temperatures, sufficiently degrade the semiconductor junction to render the circuit useless. Most consumer electronic devices rely on passive cooling, or use fans to cool electrical components. However, these cooling means are inadequate for high performance circuits, such as those that must dissipate a very large amount of power, or for closely packed circuits, or circuits that are designed to function extremely quickly. In such circuits, heat buildup is a factor that can limit system performance. If available, a more aggressive, more powerful cooling means can be used to provide better performance. Active cooling means, including forced coolant flow systems, have been used with integrated circuits. For example, a so-called "thermal conduction module", comprising a complicated structure including pistons and springs, is presently used in IBM products.

Microchannels, which are small microscopic channels formed in silicon wafers, have been disclosed to be effective heat sinks for integrated circuits. When a coolant is forced through such microchannel coolers, it has been demonstrated that a large amount of heat can be removed from a small area. For example, Tuckerman, in U.S. Pat. No. 4,573,067, discloses a semiconductor chip including microscopic channels defined by fins in intimate contact with the chip. The microscopic channels are enclosed by a cover, to enclose the channels. Fluid flow through the channels is disclosed to be approximately laminar.

Microchannels themselves have received much attention. However, little attention has been focused on the means for delivery of coolant to the microchannels. A prior art microchannel cooling system is illustrated in the exploded view of FIG. 1. A top silicon layer 10, a middle glass layer 12, and a plastic manifold layer 14 are connected together to form a cooler assembly 16. The underside of the top layer 10 comprises silicon microchannels 20. The middle layer 12 comprises two glass slots 22, 24 that extend therethrough. The bottom plastic layer 14, which is connected to the coolant delivery tubes 26, 28, includes a cavity 30,32. In operation, coolant flows from the tube 26, through the cavity 30 in the plastic layer 14, and into the slot 22. From there, the coolant then flows through the microchannels 20, absorbing heat. The heated coolant flows into the other slot 24, through the cavity 32 in the bottom layer 14, and out the tube 28.

In the prior art configuration of FIG. 1, several problems have arisen that limit the cooling performance of the system. One problem is the leaks that frequently appear at the connection between the plastic layer 14 and the middle layer 12. This problem raises reliability issues at low pressures and restricts the upper pressure limit of the prior art heat sink. Higher pressure means more cooling; thus the leaks represent a limit on the effective cooling available. An effective bond between plastic and glass is not readily achievable, and thus this connection has a propensity to leak. In contrast, the silicon-glass bond between the top layer 10 and the middle layer 12 is very strong, and can withstand much more pressure than the glass-plastic connection. Thus, the glass layer 12 was commonly used as a cover for the microchannels 20.

Another problem with the prior art is an insufficient thermal range-at very hot or cold temperatures the prior art heat sink of FIG. 1 is easily susceptible to breakage and leaking. Thermal range is limited by the mismatch in thermal expansion coefficients between the plastic layer 14 and the glass layer 12. This mismatch problem increases in importance as the temperature deviates significantly from room temperature. The effect of an expansion mismatch is a degradation of the structural integrity, the possibility of cracking, and an increase in the likelihood of leaks. Another weak part in the prior art heat sink is the tube insertion point-the connection between the heat sink and the coolant tube. Conventionally, this connection is accomplished by cementing the heat sink to the coolant tube. Cracking and leaking of coolant from these connections is common, even within a narrow temperature range.

Generally, the thermal range of the prior art is very limited. The problem is particularly acute at high temperatures, for example 250° C., or at cryogenic temperatures. Liquid nitrogen can be maintained at −196° C., and it would be an advantage to provide a microchannel heat sink that can effectively cool with liquid nitrogen as the active coolant. Such a cooler would have uses in superconducting technology, which requires cryogenic temperatures to maintain their superconductivity, Such a cooler may also have use in supercomputers, which have a high density of components and short connections, thereby requiring a great amount of cooling power. Presently, supercomputer circuits are immersed in a cooling fluid, an arrangement which provides some cooling; but not a great deal due to the limited thermal conductivity between the fluid and circuits. Another problem with direct immersion is the reliability of the circuits is compromised by fluid leaks and the corrosiveness of the fluid. It would be an advantage to provide effective cooling of supercomputer circuits with a coolant that is isolated from the electrical components, and that has much higher thermal conductivity than immersion cooling.

SUMMARY OF THE INVENTION

The present invention provides a small, inexpensive microchannel heat sink that has a wide thermal range. The heat sink is suitable for low temperature operation at cryogenic temperatures, and is also suitable for high temperature operation at several hundred degrees centigrade. The heat sink can be used with a wide variety of fluids, even those that are corrosive to most materials. Furthermore, the microchannel heat sink can be operated at a high pressure to provide a large coolant flow and therefore more robust cooling.

The present invention comprises a microchannel heat sink formed of two layers, a microchannel layer and a manifold layer. Preferably, the microchannel layer comprises silicon and the manifold layer comprises glass that has similar expansion properties, to provide a wide thermal range for the heat sink. These materials can be tightly bonded to provide reliability and to withstand high pressure. The silicon layer has microchannels etched therein. The glass layer, on its side facing the microchannels, comprises an inlet manifold and an outlet manifold. The inlet manifold is positioned to supply coolant to the inlet section of the microchannels, and the outlet manifold is positioned to receive coolant from the outlet section of the microchannels. In a preferred embodiment, the manifold layer further comprises two holes, an inlet hole extending from the bottom of the manifold layer to the inlet manifold, and an outlet hole extending from the bottom of the manifold layer to the outlet manifold. Coolant is supplied to the heat sink through a conduit assembly that is connected to the heat sink. In a preferred embodiment, a clamp holds the conduit assembly to the heat sink, and a resilient seal is disposed between the conduit and the hole in the heat sink. The resilient seal, such as a gasket or an O-ring, is compressed in order to provide a watertight seal, even under high pressure. For some applications, the conduit assembly may comprise a metal tube which is connected to the heat sink by a soft solder. In other applications, the heat sink may comprise a nipple extending therefrom, and the conduit assembly comprises a tube that is inserted over the nipple. Within a wide range of temperatures, the integrity of the watertight seal remains. Each component of the conduit assembly is not rigidly affixed to the heat sink; i.e., room for expansion exists to allow expansion and contraction without breakage.

A coolant circulation system supplies coolant to the conduit assembly; a pair of tubes supply coolant from the coolant circulation system. In operation, coolant flows under pressure from the coolant circulation system, through an inlet tube, through the inlet conduit, out the exit port and into the inlet hole, and then into the inlet manifold. There, the coolant is forced into one end of the microchannels, and it flows to the other end of the microchannels, absorbing heat as it flows therethrough. The heated coolant exits the microchannels, flows into the outlet manifold and then through the outlet hole, into the outlet conduit which leads to an outlet tube and the coolant circulation system. Because a strong bond exists between the silicon layer and the glass layer, and because the connections between the tubes and the heat sinks can withstand a high pressure, a high coolant pressure may be applied in order to provide a large cooling power.

The present invention provides a low-cost, versatile, heat sink with many potential uses. Its small size and reliability is an advantage, and it is simple to construct using conventional methods. Its wide thermal range allows use of any of a variety of coolants. For example, liquid nitrogen, at −196° C., may be used as a coolant, or liquid hydrogen, or liquid helium, in order to cool a material to superconducting temperatures. For other uses, a more conventional coolant, such as freon, may be used. Even water may be utilized for the coolant. The microchannel heat sink of the present invention can be used in supercomputers in order to cool the densely packed circuits of the supercomputer. The present invention can also be used to cool integrated circuits and other electronic devices.

BRIEF DESCRIPTION OF THE DRAWINGS

FIG. 5 is a side view, partly in section, of the heat sink of the present invention, showing its connections with the conduit assemblies and the coolant circulation system.

DETAILED DESCRIPTION OF THE INVENTION

The invention is best understood by reference to the figures wherein like parts are designated with like numerals throughout.

The present invention provides a small, inexpensive microchannel heat sink that has a wide thermal range, including the temperature of liquid nitrogen (−196° C.), and the temperatures of several hundred degrees centigrade. The heat sink can be used with a wide variety of fluids, even those that are corrosive to most materials. Furthermore, the microchannel heat sink can withstand a high pressure to provide more robust cooling via a large coolant flow.

Figure 2:
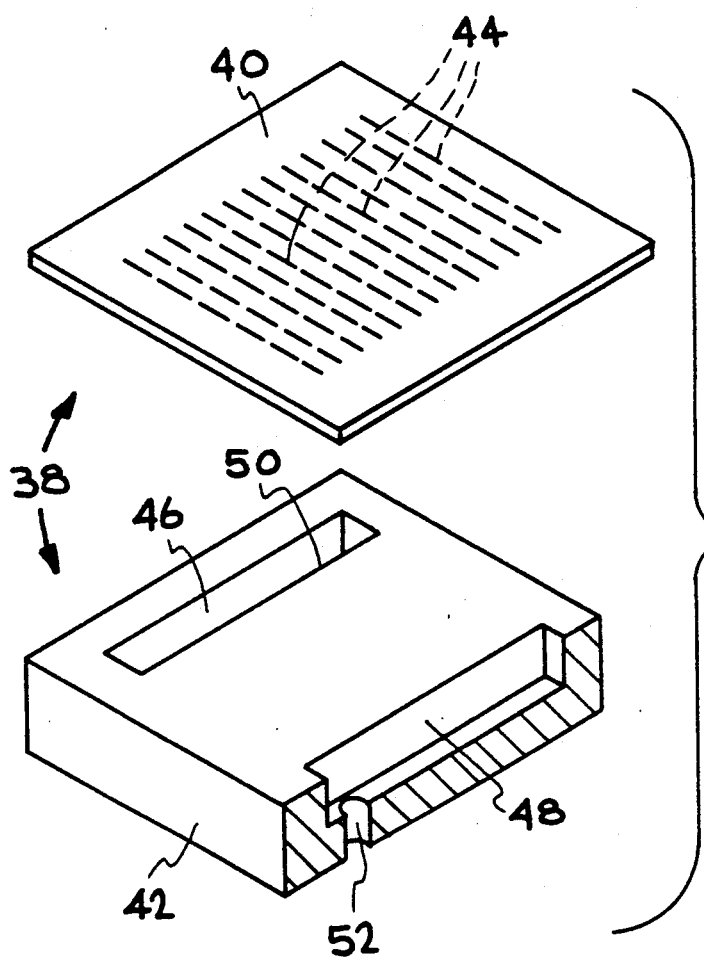
FIG. 2 is an exploded view of a microchannel heat sink of the present invention.

Reference is made to FIG. 2, which is an exploded view of a microchannel heat sink 38. The heat sink 38 comprises two layers, a microchannel layer 40, preferably formed of silicon and a manifold layer 42, preferably formed of glass with an expansion constant similar to that of silicon. The microchannel layer 40 has a plurality of parallel microchannels 44 etched on the bottomside in accordance with conventional techniques. Preferably, the microchannels are approximately 0.05 mm wide, 0.5 mm deep, and 10 mm long for use with water cooling, however, different dimensions to improve heat transfer with other type fluids would be chosen. The microchannel layer 40 may be formed from a conventional silicon wafer. As illustrated, the microchannels 44 are formed within the outline of a rectangular shape; in other embodiments, the microchannels 44 may be formed within other outlines as appropriate for the application.

The manifold layer 42 comprises an inlet groove 46 and an outlet groove 48. The grooves 46,48 are etched in the top of the layer 42 in accordance with conventional etching techniques, such as chemical etching (using conventional photolithographic masking and wet etching), or physcial etching (using sawing, milling, or drilling techniques). Preferably, the grooves 46,48 are etched in a depth as great as possible commensurate with maintaining adequate glass thickness, and have a cross-section that is approximately rectangular, with rounded corners and ends; however, the grooves 46,48 may comprise any of a variety of shapes and sizes suitable to allow an adequate coolant flow. Preferably, the manifold layer 42 comprises glass of between 0.5 to 5 mm thick; it is believed that thinness increases the thermal range by avoiding thermal cracking that would occur if thicker glass were used. The manifold layer 42 further comprises two holes, an inlet hole 50 extending from the bottomside to the inlet groove 46, and an outlet hole 52 extending from the bottomside to the outlet groove 48. The holes 50, 52 are formed by conventional physical fabrication, such as drilling, milling, or chemical etch methods. Each groove 46,48 is formed with a shape to facilitate coolant flow from the respective holes 50,52.

Figure 3:
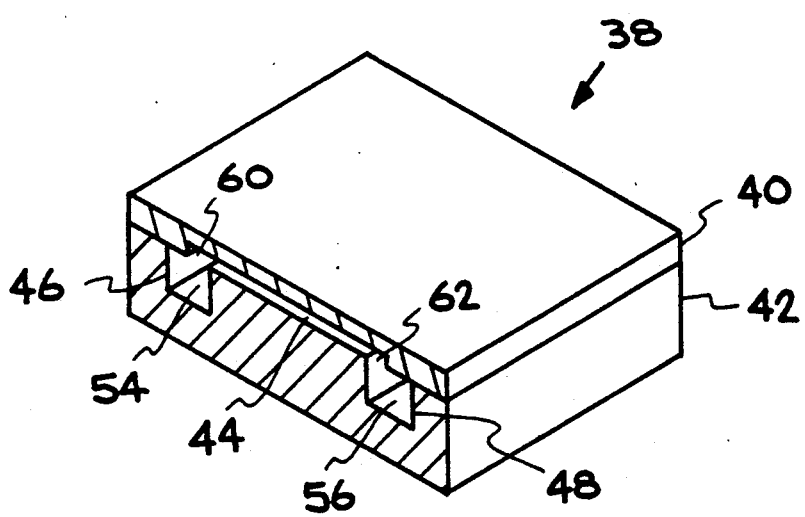
FIG. 3 is a perspective, cross-sectional view of a heat sink shown in FIG. 2.

Reference is made to FIG. 3, in which a cross-section of the heat sink 38 is shown. The heat sink 38 is shown assembled, with the microchannel layer 40 connected to the manifold layer 42. The microchannel layer 40 is bonded to the manifold layer 42 by conventional techniques, preferably glass to silicon reflow bonding, wherein the glass is heated to a temperature near its softening point, at which time the glass wets the thin oxide on the silicon surface. When the layers 40,42 are bonded, an inlet manifold 54 is formed by the inlet groove 46 and a portion of the microchannel layer 40. Similarly, an outlet manifold 56 is formed by the outlet groove 48 covered with a portion of the microchannel layer 40. The microchannels 44 are covered by the adjacent portion of the manifold layer 42. The inlet manifold 54 communicates coolant to an inlet end 60 of the microchannels 44, and the outlet manifold 56 communicates coolant to an outlet end 62.

In operation, with reference to FIGS. 2 and 3, coolant is supplied through the inlet hole 50 to the inlet manifold 54, which delivers the coolant to the inlet end 60 of the microchannels 44. Coolant flows through the microchannels 44, absorbing heat, and exits from the opposite, outlet end 62 of the microchannels 44. The heated coolant flows into the outlet manifold 56, and then exits through the outlet hole 52. In experimental tests of the heat sink 38, a heat flux of 1000 watts/cm$^2$ has been successfully removed from the surface of the microchannel layer 40 while keeping the rise in surface temperature to less than 100° C., using water as a coolant. Furthermore, static pressure tests have shown that heat sink 38 can withstand pressures of over 25 atmospheres.

Figure 4A:
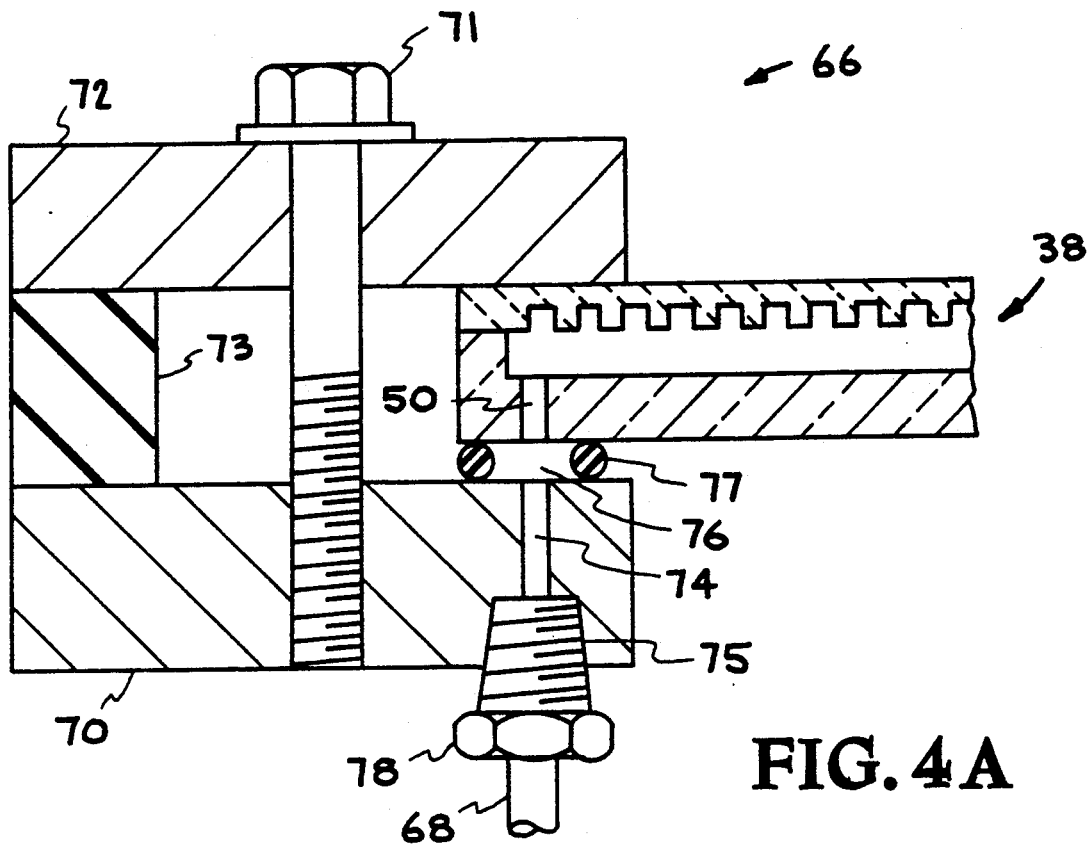
FIG. 4A is a cross-sectional view of a portion of the heat sink and the a conduit assembly connected to the heat sink.
Figure 4B:
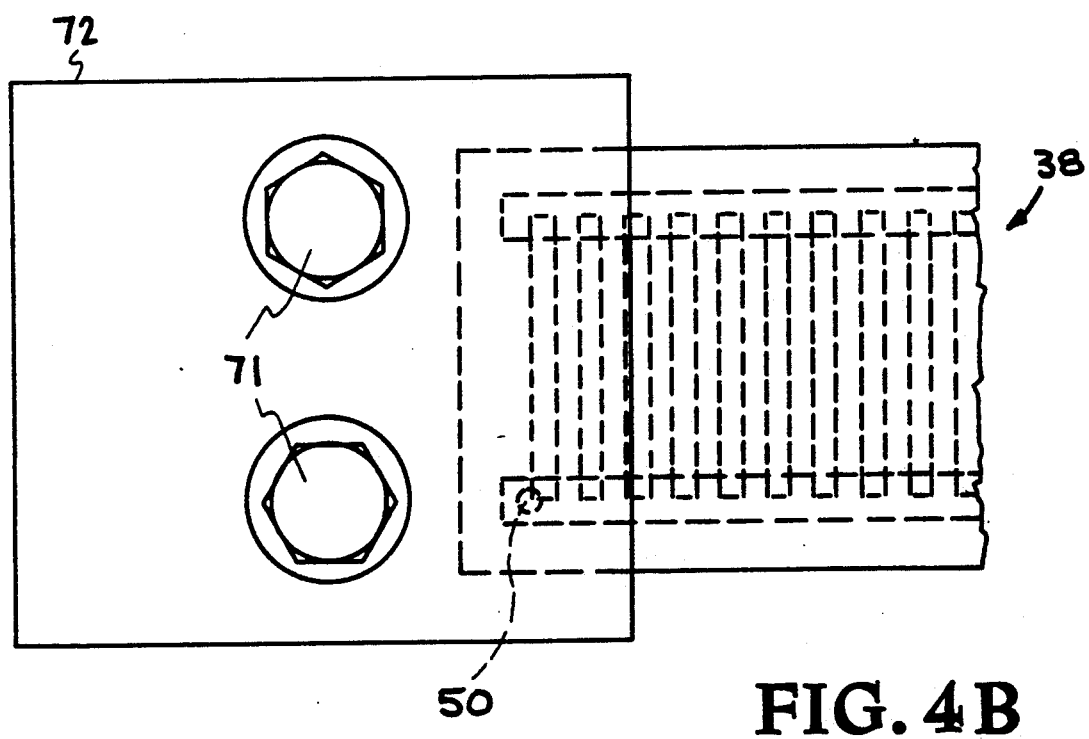
FIG. 4B is a top view of the portion of the heat sink and conduit assembly shown in FIG. 4A.

Reference is now made to FIGS. 4A,4B and 5 to illustrate the heat sink 38 connected to an inlet conduit assembly 66, which provides a means for connecting a coolant circulation system 64 to the heat sink 38. FIG. 4A is a cross-sectional view of a connected heat sink 38 and conduit assembly 66, and FIG. 4B is a top view. FIG. 5 is a side view of the heat sink 38, illustrating its connections with the inlet conduit assembly 66 and a similar outlet conduit assembly 67. Coolant is supplied to the heat sink 38 via an inlet tube 68, and coolant is removed from the coolant circulation system 62 via an outlet tube 69.

With reference to FIGS. 4A and 4B, the conduit assembly 66 comprises a conduit block 70 which is connected by bolts 71 to a top block 72. As illustrated, a portion of the heat sink 38 is wedged between the blocks 70,72 on one side of the assembly, and a spacer block 73 is positioned between the blocks 70,72 in order to maintain the blocks 70,72 approximately perpendicular to the flat sides of the heat sink 38. The blocks 70,72,73 may comprise any suitable material such as plastic or metal. For low temperature cryogenic operation, the blocks 70,72,73 are preferably metal. The spacer block 73 may comprise a resilient material such as hard rubber; for cryogenic applications, the spacer block is preferably indium metal. The conduit block 70 comprises a conduit 74 formed therein using conventional drilling techniques. The conduit 74 extends from a threaded entrance 75 to an exit port 76 which is positioned proximate to the inlet hole 50 on the heat sink 38. A resilient seal 77, such as a gasket or an O-ring, is disposed between the heat sink 38 and the conduit block 70 in a position surrounding the exit port 76, in order to provide a watertight passageway from the exit port 76 to the inlet hole 50. The resilient seal 77 can be compressed by tightening the bolts 71 to press the blocks 70,72 closer together.

FIG. 5 illustrates the complete configuration wherein the coolant circulation system 64 is connected to the heat sink 38 on the inlet side via the inlet tube 68 and the inlet conduit assembly 66, and on the outlet side the coolant circulation system 64 is connected via the outlet conduit assembly 67 and the outlet tube 69. Preferably, the inlet tube 68 is connected to a threaded hollow tip 78, which is inserted and cemented or screwed into the threaded entrance 75 (FIG. 4A). The outlet conduit assembly 67 is preferably similar to the inlet conduit assembly 66. For example, the outlet tube 69 may be connected to a hollow threaded tip 79, which is inserted into an exit port 80. A conduit 81 formed in a conduit block 82 extends from the exit port 80 to an entrance port 83, which is aligned with the outlet hole 52. A resilient seal 84, such as a gasket or an O-ring, is positioned surrounding the port 83 to provide a watertight passageway from the outlet hole 52 in the heat sink 38 to the port 83.

The coolant circulation system 64 may use, as a coolant, any of a number of typical cooling fluids, such as water, the choice of which is determined by the type of cooling that is desired. In addition, due to the wide thermal range of the heat sink 38, cryogenic fluids may be used as the coolant. Many potential uses are envisioned for the present invention; many types of cooling fluids may be used. The wide thermal range of the heat sink 38 accommodates use of cryogenic coolants, such as liquid nitrogen, at −196° C., or colder temperature fluids such as liquid hydrogen or liquid helium. At higher temperatures, a more typical coolant, such as freon or water, may be used.

Figure 6:
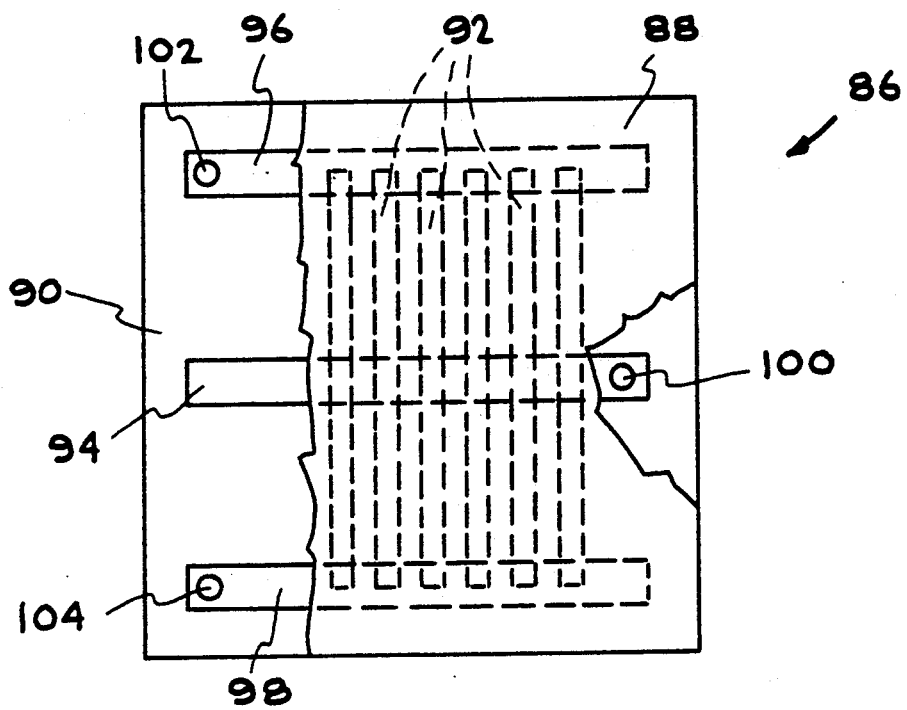
FIG. 6 is a top view of another embodiment of a microchannel heat sink, with the microchannel layer removed on both sides to reveal the inlet and outlet holes and manifolds.
Figure 7:
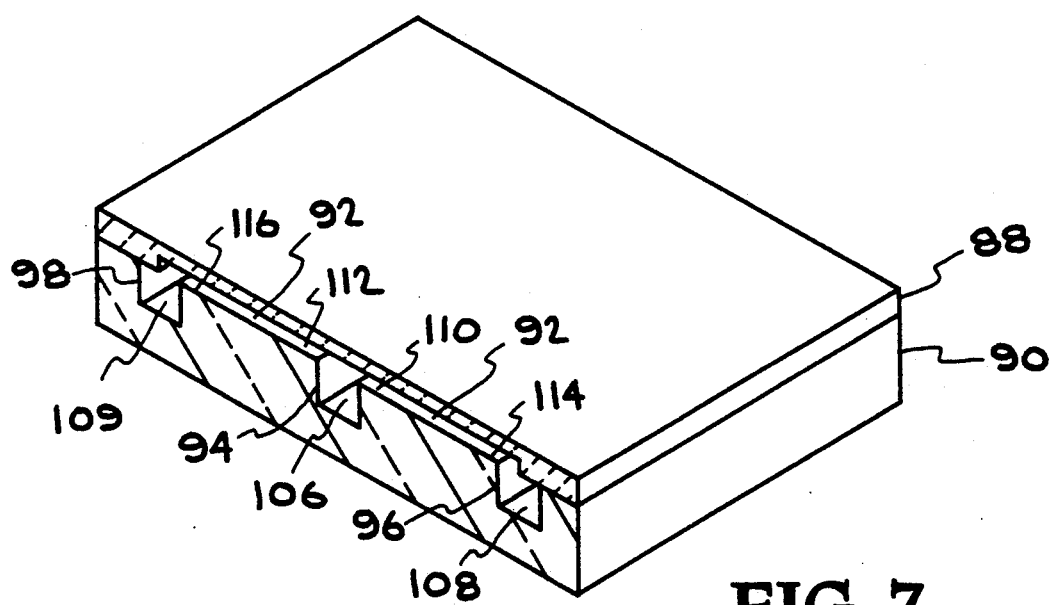
FIG. 7 is a perspective, cross-sectional view of the embodiment of the heat sink shown in FIG. 6.

FIG. 6 is a top view of an alternative embodiment of the present invention, with portions removed to illustrate the manifolding structure, and FIG. 7 is a cross-sectional view of the embodiment of FIG. 6. The heat sink 86 comprises two layers, a microchannel layer 88, preferably formed of silicon and a manifold layer 90, preferably formed of glass. The microchannel layer 88 has a plurality of parallel microchannels 92 etched on the bottomside in accordance with conventional techniques. As illustrated, the microchannels 92 are formed within the outline of a rectangular shape; in other embodiments, the microchannels 92 may be formed within other outlines as appropriate for the application.

The manifold layer 90 comprises an inlet groove 94 positioned between two outlet grooves 96,98. The grooves 94,96,98 are etched in the top of the layer 90 in accordance with conventional etching techniques. Preferably, the grooves 94,96,98 have a cross-section that is approximately rectangular, with rounded corners and ends; however, the grooves 94,96,98 may comprise any of a variety of shapes and sizes suitable to facilitate an adequate coolant flow. The manifold layer 90 further comprises three holes, an inlet hole 100 extending from the bottomside to the inlet groove 94, an outlet hole 102 extending from the bottomside to the outlet groove 96, and an outlet hole 104 extending from the bottomside to the outlet groove 98. The holes 100,102,104 are formed by conventional drilling methods. Each groove 94,96,98 is formed with a shape to facilitate coolant flow from the respective hole 100,102,104.

Reference is made to FIG. 7, in which a cross-section of the heat sink 86 is shown. The heat sink 86 is shown assembled, with the microchannel layer 88 connected to the manifold layer 90. When the layers 88,90 are bonded, an inlet manifold 106 is formed by the inlet groove 94 and a portion of the microchannel layer 88. Similarly, a first outlet manifold 108 is formed by the outlet groove 96 covered with a portion of the microchannel layer 88, and a second outlet manifold 109 is formed by the outlet groove 98 covered with a portion of the microchannel layer 88. The microchannels 92 are covered by the adjacent portion of the manifold layer 90. The inlet manifold 106 communicates coolant to both a first inlet end 110 of the microchannels 92, and a second inlet end 112 of the microchannels 92. The first outlet manifold 108 is connected to an outlet end 114 of the microchannels 92, and the second outlet manifold 109 is connected to a second outlet end 116 of the microchannels 92.

In operation, with reference to FIGS. 5 and 6, coolant is supplied through the inlet hole 100 to the inlet manifold 106, which delivers the coolant to the inlet ends 110,112 of the microchannels 92. Coolant flows away from the inlet manifold 106, through the microchannels 92, absorbing heat. Coolant flowing from the first inlet end 110 exits from the first outlet end 114 of the microchannels 92, and coolant flowing from the second inlet end 112 exits from the second outlet end 116 of the microchannels 92. The heated coolant flows into the respective outlet manifold 108 or 109, and then exits through the respective outlet hole 100,102,104.

In respect to its method of connection to a coolant circulation system 64, shown in FIG. 5, the heat sink 86 shown in FIG. 6 is analogous to the heat sink 38 shown in FIG. 2, Particularly, in connection using tubes, seals, and clamps, the heat sink 86 is analogous. Additionally, the variety of coolants usable in the heat sink 38 are also usable in the heat sink 86 of FIG. 6.

Figure 1:
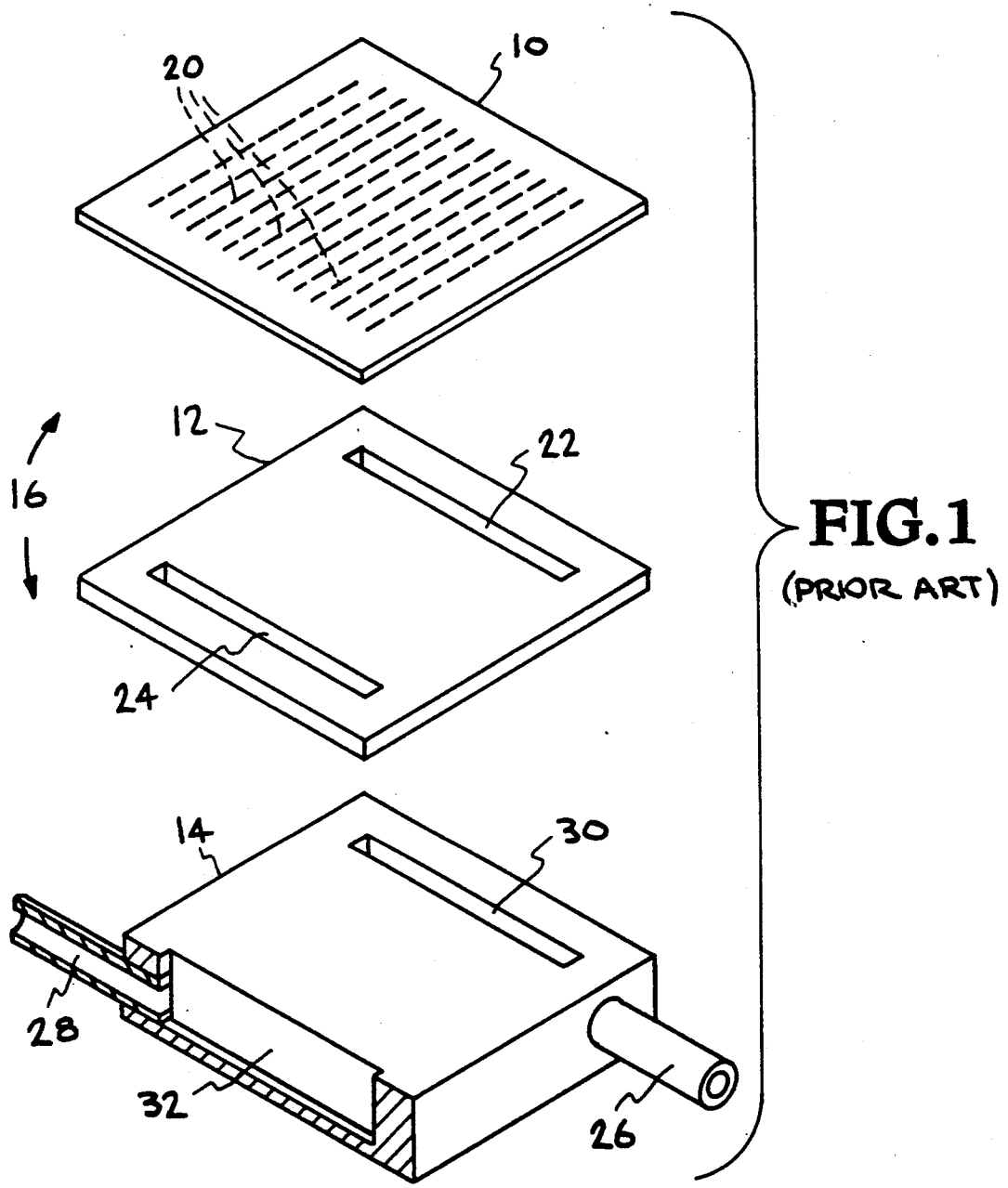
FIG. 1 is a prior art configuration of a microchannel cooler assembly, shown in an exploded view.
Figure 8:
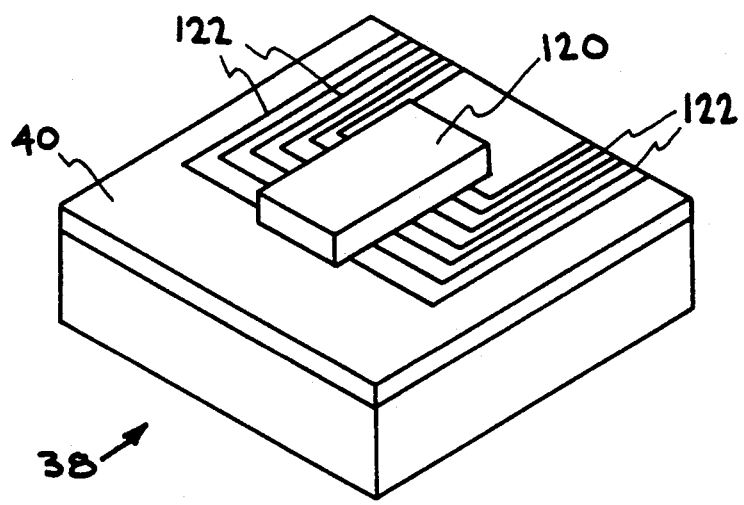
FIG. 8 is a top perspective view of the microchannel layer, in an embodiment including an integrated circuit.

FIG. 8 is a top perspective view of the microchannel layer 40, illustrating a use of the heat sink 38. An integrated circuit 120 is positioned above the microchannels 44 (FIG. 1), so that the circuit 120 can be cooled in operation. The integrated circuit 120 is bonded to the layer 40 by conventional methods. A plurality of electrical leads 122 electrically connect the integrated circuit 120 with other circuitry (not shown).

Figure 9:
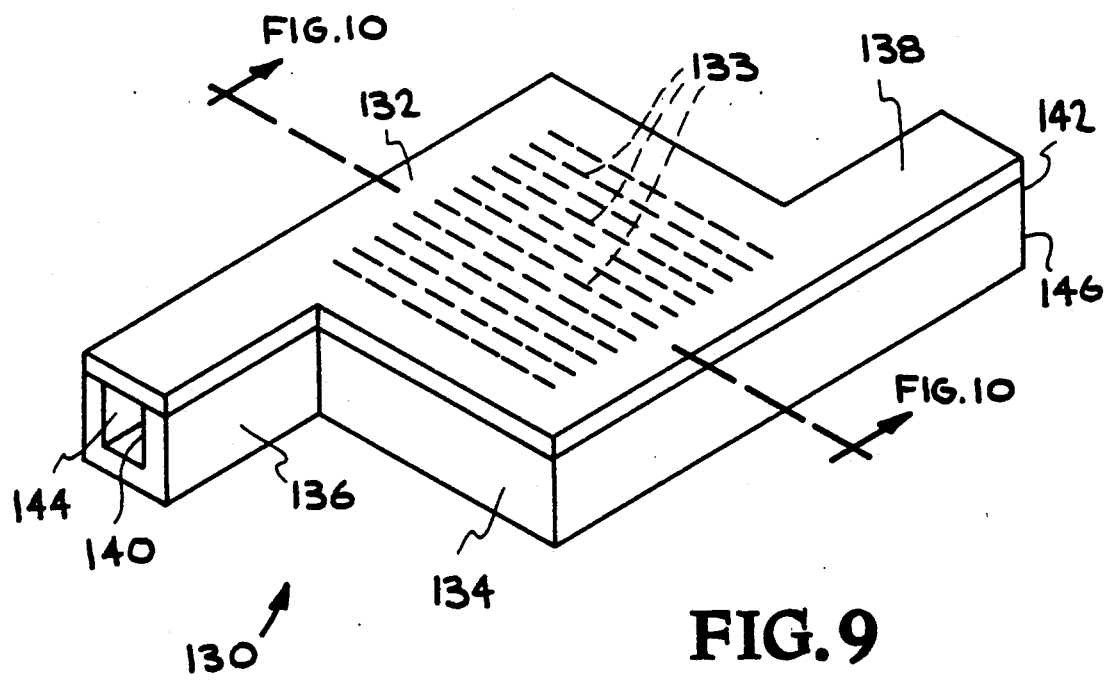
FIG. 9 is a perspective view of another embodiment of the invention including an inlet nipple and an outlet nipple.
Figure 10:
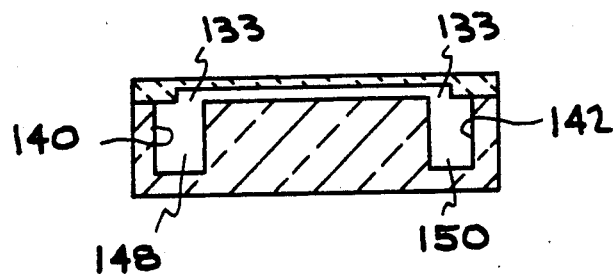
FIG. 10 is a cross section of the embodiment shown in FIG. 9.

Another preferred embodiment of the invention is shown in FIGS. 9 and 10. With reference to FIGS. 9 and 10, a heat sink 130 comprises a microchannel layer 132 including microchannels 133 formed therein, and a manifold layer 134. In respect to its materials and method of construction, the heat sink 130 is similar to the heat sink 38 disclosed previously, for example in FIG. 2. However, the heat sink 130 further comprises an inlet nipple 136 and an outlet nipple 138 formed in both the microchannel layer 132 and the manifold layer 134. Additionally, an inlet groove 140 is formed in the manifold layer 134, extending along one side of the microchannels 133 to the tip of the nipple 136. Similarly, an outlet groove 142 is formed in the manifold layer 134, extending along the microchannels 133 to the tip of the nipple 138. Preferably, the grooves 140,142 are etched in a depth as great as possible commensurate with maintaining adequate glass thickness, and have a cross-section that is approximately rectangular, with rounded corners and ends; however, the grooves 140,142 may comprise any of a variety of shapes and sizes suitable to allow an adequate coolant flow. With reference to the cross-section of FIG. 9, a coolant delivery tube 144 is defined by the groove 140 and the adjacent portion of the microchannel layer 132; similarly, a coolant return tube 146 is defined by the groove 142 and the adjacent portion of the microchannel layer 132. The outer surfaces of the nipples 136,138 preferably define an approximately circular shape in order facilitate connection to a tube. In operation, coolant, which may be supplied from an inlet tube such as the inlet tube 68 (FIG. 5) flows through the coolant delivery tube 144, into an inlet manifold area 148, from which it flows through the microchannels 133 to an outlet manifold area 150, from which it exits by the coolant return tube 146 into an outlet tube such as the outlet tube 69 (FIG. 5).

Figure 11:
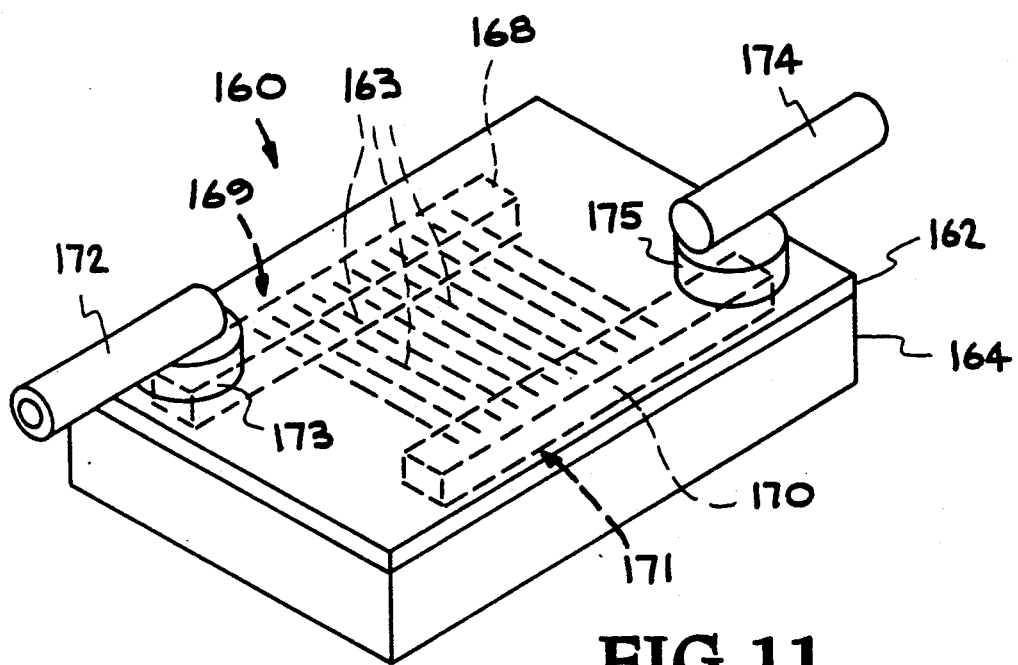
FIG. 11 is a perspective view of yet an embodiment of the present invention wherein outlet and inlet tubes are soft soldered to the heat sink.
Figure 12:
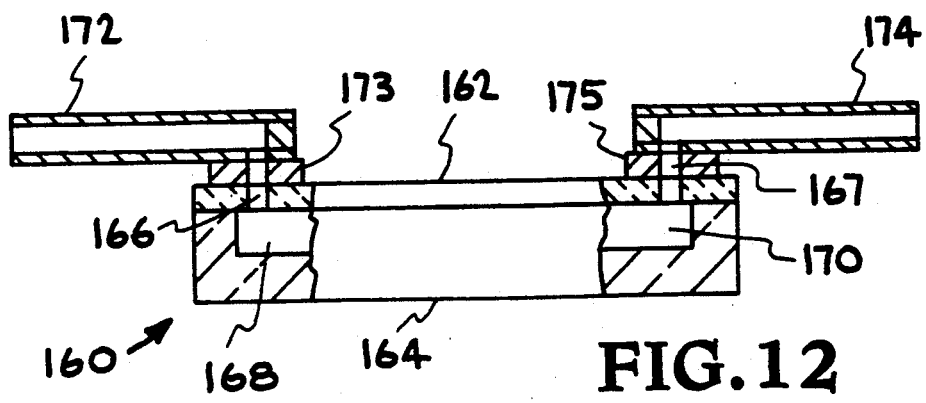
FIG. 12 is a cross section of the embodiment shown in FIG. 11.

A further preferred embodiment of the invention is illustrated in FIGS. 11 and 12. With reference to FIG. 11, a heat sink 160 comprises a microchannel layer 162 including microchannels 163 formed therein, and a manifold layer 164. In respect to its materials and method of construction, the heat sink 160 is similar to the heat sink 38 disclosed previously, for example in FIG. 2. However, the heat sink 160 comprises an inlet hole 166 (FIG. 12) formed in the microchannel layer 162, and an outlet hole 167 also formed in the microchannel layer 162. An inlet groove 168 is formed in the manifold layer 164, to form an inlet manifold 169 that extends along one side of the microchannels 163 to the inlet hole 166; similarly, an outlet groove 170 is formed in the manifold layer 164 to form an outlet manifold 171 that extends along the microchannels 163 to the outlet hole 167. Preferably, the grooves 168,170 are etched in a depth as great as possible commensurate with maintaining adequate glass thickness, and have a cross-section that is approximately rectangular, with rounded corners and ends; however, the grooves 168,170 may comprise any of a variety of shapes and sizes suitable to allow an adequate coolant flow. With reference to the perspective view of FIG. 11, an inlet tube 172 is soft soldered to the microchannel layer 162 by a solder layer 173 so that a passageway is formed between the tube 172 and the inlet manifold 169; similarly, an outlet tube 174 is soft soldered to the microchannel layer 162 by a solder layer 175 so that a passageway is formed between the tube 174 and the outlet manifold 171. The tubes 172,174 preferably comprise a corrosion resistant metal such as copper, and the solder layers 173,175 preferably comprise an indium, or a lead-tin solder. The solder layers 173,175 may be bonded directly to the microchannel layer 162 and the tubes 172,174. Alternately, an adhesion layer metal such as titanium or chromium may be sputtered or evaporated onto the microchannel layer 162 or the tubes 172,174 in order to enhance adhesion, and then another layer of a metal, such as gold or copper, to which solder adheres well, may be deposited on the adhesion layer.

In operation, coolant supplied from a coolant circulation system, such as that shown in FIG. 5, flows from the inlet tube 172, through the inlet hole 166, along the inlet groove 168 to the microchannels 163. The coolant flows through the microchannels 163, absorbing heat, and exits by flowing along the outlet groove 170, through the outlet hole 167, and out the tube 174.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing descriptions. All changes which come within the meaning and range of equivalency of the claims are to be embraced within their scope.

We claim:

1. A heat sink for heat transfer to a fluid circulated by a fluid circulation system, said heat sink comprising:
   a microchannel layer of a single material comprising a plurality of microchannels formed on one side of said layer; and,
   a manifold layer of a single material bonded directly to the microchannel layer so that the microchannels face the manifold layer, said manifold layer comprising,
   an inlet groove,
   an inlet hole connected to the inlet groove,
   an outlet groove, and
   an outlet hole connected to the outlet groove;
   said microchannel layer and said manifold layer being positioned in a cooperating relationship so that an inlet manifold is defined by said inlet groove and the adjacent portion of the microchannel layer, and an outlet manifold is defined by said outlet groove and the adjacent portion of the microchannel layer, and further, the inlet manifold is positioned to provide fluid flow between the inlet hole and the microchannels, and the outlet manifold is positioned to provide fluid flow between the microchannels and the outlet hole.

2. The heat sink as claimed in claim 1, wherein the manifold layer further comprises a second outlet groove and a second outlet hole connected to the second outlet groove; said second groove being positioned so that the inlet groove is positioned between the two outlet grooves and parallel thereto, said microchannel layer and said manifold layer being positioned in a cooperating relationship so that a second outlet manifold is defined by said outlet groove and the adjacent portion of the microchannel layer, and, the second outlet manifold is positioned to provide fluid flow between the second outlet hole and the microchannels.

3. The heat sink as claimed in claim 1, wherein a coolant, circulated through the microchannels, comprises a cryogenic fluid.

4. The heat sink as claimed in claim 3, wherein the cryogenic coolant comprises liquid nitrogen.

5. A heat transfer assembly as claimed in claim 1, wherein the microchannel layer comprises silicon.

6. A heat transfer assembly as claimed in claim 5, wherein the manifold layer comprises glass with an expansion constant similar to that of silicon.

7. The heat sink as claimed in claim 1, further comprising:
   an inlet conduit assembly connected to the circulation system and clamped to said heat sink, wherein;
   said inlet conduit assembly comprises first and second opposing solid blocks clamped to said heat sink so that said first block exerts pressure on said microchannel layer, and said second block exerts an opposing pressure on said manifold layer, wherein said second block includes an integral inlet conduit that is positioned in alignment with said inlet hole in said manifold layer when said inlet assembly is clamped to said heat sink, including;
   a resilient inlet seal disposed between said second block and said manifold layer, said seal surrounding said inlet hole in said manifold layer and said inlet conduit in said second block, wherein;
   said pressure that said second block exerts on said manifold layer compresses said resilient inlet seal so as to prevent coolant leakage at the junction between said inlet conduit and said inlet hole;
   an outlet conduit assembly connected to the circulation system and clamped to said heat sink, wherein;
   said outlet conduit assembly comprises third and fourth opposing solid blocks clamped to said heat sink so that said third block exerts pressure on said microchannel layer, and said fourth block exerts an opposing pressure on said manifold layer, wherein said fourth block includes an integral outlet conduit that is positioned in alignment with said outlet hole in said manifold layer when said outlet assembly is clamped to said heat sink, including;
   a resilient outlet seal disposed between said fourth block and said manifold layer, said seal surrounding said outlet hole in said manifold layer and said outlet conduit in said fourth block;
   said pressure that said fourth block exerts on said manifold layer compresses said resilient outlet seal so as to prevent coolant leakage at the junction between said outlet conduit and said outlet hole.

8. A heat sink assembly for heat transfer to a fluid circulated by a fluid circulation system, said heat sink assembly comprising:
   a microchannel layer of a single material comprising a plurality of microchannels formed on one side of said layer;
   a manifold layer of a single material bonded directly to the microchannel layer so that the microchannels face the manifold layer, said manifold layer and said microchannel layer forming an inlet nipple and an outlet nipple for connection to the fluid circulation system, said manifold layer comprising an inlet groove defining an inlet manifold that communicates coolant to the microchannels, said inlet groove also defining a coolant delivery tube extending from the inlet manifold through the inlet nipple, said manifold layer further comprising an outlet groove defining an outlet manifold that receives coolant from the microchannels, said outlet groove also defining a coolant delivery tube extending from the outlet manifold through the outlet nipple.

9. The heat sink assembly as claimed in claim 8, wherein the inlet nipple and the outlet nipple have an outer surface suitable for connection to an inlet tube and an outlet tube.

10. The heat sink assembly as claimed in claim 9, wherein the inlet nipple and the outlet nipple have an outer surface with an approximately circular shape.

11. The heat sink assembly as claimed in claim 8, wherein the microchannel layer comprises silicon.

12. The heat sink assembly as claimed in claim 11, wherein the manifold layer comprises glass with an expansion constant similar to that of silicon.

13. A heat sink assembly for heat transfer to a fluid circulated by a fluid circulation system, said heat sink assembly comprising:
 a microchannel layer of a single material comprising a plurality of microchannels formed on one side of said layer, said microchannel layer comprising an inlet hole formed therein and an outlet hole formed therein;
 a manifold layer of a single material bonded directly to the microchannel layer so that the microchannels face the manifold layer, said manifold layer comprising an inlet groove defining an inlet manifold that communicates coolant from the inlet hole in the microchannel layer to the microchannels, said manifold layer further comprising an outlet groove defining an outlet manifold that communicates coolant between the microchannels and the outlet hole in the microchannel layer.

14. The heat sink assembly as claimed in claim 13, wherein the microchannel layer comprises silicon.

15. The heat sink assembly as claimed in claim 14, wherein the manifold layer comprises glass with an expansion constant similar to that of silicon.

16. The heat sink assembly as claimed in claim 13, further comprising an inlet tube soldered surrounding the inlet hole in the microchannel layer, and also comprising an outlet tube soldered surrounding the outlet hole in the microchannel layer.

17. The heat sink assembly as claimed in claim 16, wherein the solder connecting the tubes with the microchannel layer comprises a soft solder material.

18. The heat sink assembly as claimed in claim 17, wherein the soft solder material comprises a lead-tin solder.

* * * * *